US009209352B2

(12) United States Patent
Tu et al.

(10) Patent No.: US 9,209,352 B2
(45) Date of Patent: Dec. 8, 2015

(54) SURFACE-PASSIVATED SILICON QUANTUM DOT PHOSPHORS

(71) Applicant: University of Washington through its Center for Commercialization, Seattle, WA (US)

(72) Inventors: Chang-Ching Tu, Seattle, WA (US); Guozhong Cao, Seattle, WA (US); Lih Y. Lin, Seattle, WA (US)

(73) Assignee: University of Washington through its Center for Commercialization, Seattle, WA (US)

( * ) Notice: Subject to any disclaimer, the term of this patent is extended or adjusted under 35 U.S.C. 154(b) by 0 days.

(21) Appl. No.: 14/361,955

(22) PCT Filed: Nov. 30, 2012

(86) PCT No.: PCT/US2012/067425
§ 371 (c)(1),
(2) Date: May 30, 2014

(87) PCT Pub. No.: WO2013/082516
PCT Pub. Date: Jun. 6, 2013

(65) Prior Publication Data
US 2014/0339499 A1    Nov. 20, 2014

Related U.S. Application Data

(60) Provisional application No. 61/564,947, filed on Nov. 30, 2011.

(51) Int. Cl.
*H01J 1/62*    (2006.01)
*H01J 63/04*    (2006.01)
(Continued)

(52) U.S. Cl.
CPC .............. *H01L 33/06* (2013.01); *C09K 11/02* (2013.01); *C09K 11/025* (2013.01); *C09K 11/59* (2013.01);
(Continued)

(58) Field of Classification Search
CPC ........ B82Y 30/00; B82Y 20/00; B82Y 40/00; H01F 1/061; H01F 1/0054; H01F 1/24; C09K 11/025; C09K 11/70; C09K 11/02; C09K 11/59
USPC ......... 313/498, 483, 485, 489, 512, 502, 503, 313/506; 252/500, 301.4 R, 301.16
See application file for complete search history.

(56) References Cited

U.S. PATENT DOCUMENTS 7,264,527 B2 *  9/2007  Bawendi et al. ................ 445/24
8,343,575 B2 *  1/2013  Dubrow ........................ 427/214
(Continued)

FOREIGN PATENT DOCUMENTS

KR  10-2011-0092894 A    8/2011

OTHER PUBLICATIONS

International Search Report and Written Opinion mailed Feb. 15, 2013, issued in International Application No. PCT/US2012/067425, filed Nov. 30, 2012, 7 pages.
(Continued)

*Primary Examiner* — Thomas A Hollweg
*Assistant Examiner* — Kevin Quarterman
(74) *Attorney, Agent, or Firm* — Christensen O'Connor Johnson Kindness PLLC

(57) ABSTRACT

Phosphors formed using silicon nanoparticles are provided. The phosphors exhibit bright fluorescence and high quantum yield, making them ideal for lighting applications. Methods for making the silicon phosphors are also provided, along with lighting devices that incorporate the silicon phosphors.

23 Claims, 11 Drawing Sheets

(51) Int. Cl.
    H01L 33/06    (2010.01)
    C09K 11/02    (2006.01)
    C09K 11/59    (2006.01)
    H01L 33/00    (2010.01)
    H01L 33/44    (2010.01)
    H01L 33/56    (2010.01)
    H01L 33/50    (2010.01)
(52) U.S. Cl.
    CPC .......... *H01L 33/002* (2013.01); *H01L 33/0054* (2013.01); *H01L 33/44* (2013.01); *H01L 33/56* (2013.01); *H01L 33/50* (2013.01)

(56) References Cited

U.S. PATENT DOCUMENTS

| | | | |
|---|---|---|---|
| 8,847,197 B2* | 9/2014 | Pickett et al. | 257/13 |
| 2003/0066998 A1* | 4/2003 | Lee | 257/19 |
| 2006/0019098 A1* | 1/2006 | Chan et al. | 428/403 |
| 2006/0105170 A1* | 5/2006 | Dobson et al. | 428/403 |
| 2007/0059705 A1* | 3/2007 | Lu et al. | 435/6 |
| 2008/0121844 A1* | 5/2008 | Jang et al. | 252/301.33 |
| 2008/0230750 A1 | 9/2008 | Gillies | |
| 2009/0212258 A1* | 8/2009 | McCairn et al. | 252/301.36 |
| 2010/0068522 A1* | 3/2010 | Pickett et al. | 428/402 |
| 2010/0221544 A1 | 9/2010 | Baumer | |
| 2013/0140506 A1* | 6/2013 | Gamelin et al. | 252/519.4 |

OTHER PUBLICATIONS

Ye, L., et al., "A Pilot Study in Non-Human Primates Shows No Adverse Response to Intravenous Injection of Quantum Dots," Nature: Nanotechnology 7(7):453-458, May 2012.
Yong, K.-T., et al., "Nanotoxicity Assessment of Quantum Dots: From Cellular to Primate Studies," Chemical Society Reviews 42(3):1236-1250, Feb. 2013.
Zhang, X., et al., "A New Solution Route to Hydrogen-Terminated Silicon Nanoparticles: Synthesis, Functionalization and Water Stability," Nanotechnology 18(9):095601, Mar. 2007, 6 pages.
Zhao, Y., et al., "High-Temperature Luminescence Quenching of Colloidal Quantum Dots," ACS Nano 6(10):9058-9067, Oct. 2012.
Ziegler, J., et al., "Silica-Coated InP/ZnS Nanocrystals as Converter Material in White LEDs," Advanced Materials 20(21):4068-4073, Nov. 2008.
Maier-Flaig, F., et al., "Multicolor Silicon Light-Emitting Diodes (SiLEDs)," Nano Letters 13(2):475-480, Feb. 2013.
Mangolini, L., et al., "High-Yield Plasma Synthesis of Luminescent Silicon Nanocrystals," Nano Letters 5(4):655-659, Apr. 2005.
"The Many Aspects of Quantum Dots," Nature: Nanotechnology 5(6):381, Jun. 2010.
Mason, M.D., et al., "Luminescence of Individual Porous Si Chromophores," Physical Review Letters 80(24):5405-5408, Jun. 1998.
Mastronardi, M.L., et al., "Size-Dependent Absolute Quantum Yields for Size-Separated Colloidally-Stable Silicon Nanocrystals," Nano Letters 12(1):337-342, Jan. 2012.
McKinsey & Company, "Lighting the Way: Perspectives on the Global Lighting Market," www.mckinsey.com, Jul. 2011, 68 pages.
Medintz, I.L., et al., "Quantum Dot Bioconjugates for Imaging, Labelling and Sensing," Nature: Materials 4(6):435-446, Jun. 2005.
Medintz, I.L., et al., "Self-Assembled Nanoscale Biosensors Based on Quantum Dot FRET Donors," Nature: Materials 2(9):630-638, Sep. 2003.
Miyawaki, A., "Visualization of the Spatial and Temporal Dynamics of Intracellular Signaling," Developmental Cell 4(3):295-305, Mar. 2003.
Murase, N., and C. Li, "Consistent Determination of Photoluminescence Quantum Efficiency for Phosphors in the Form of Solution, Plate, Thin Film, and Powder," Journal of Luminescence 128(12):1896-1903, Dec. 2008.

Neiner, D., et al., "Low-Temperature Solution Route to Macroscopic Amounts of Hydrogen Terminated Silicon Nanoparticles," Journal of the American Cancer Society 128(34):11016-11017, Aug. 2006.
"The New Oil?" Nature: Photonics 5(1):1, Jan. 2011.
Niu, Y.-H., et al., "Improved Performance From Multilayer Quantum Dot Light-Emitting Diodes via Thermal Annealing of the Quantum Dot Layer," Advanced Materials 19(20):3371-3376, Oct. 2007.
Nizamoglu, S., et al., "Color-Converting Combinations of Nanocrystal Emitters for Warm-White Light Generation With High Color Rendering Index," Applied Physics Letters 92(3):031102-1-031102-3, Jan. 2008.
Nizamoglu, S., et al., "Warm-White Light-Emitting Diodes Integrated With Colloidal Quantum Dots for High Luminous Efficacy and Color Rendering," Optics Letters 35(20):3372-3374, Oct. 2010.
Nizamoglu, S., et al., "White Light Generation Using CdSe/ZnS Core—Shell Nanocrystals Hybridized With InGaN/GaN Light Emitting Diodes," Nanotechnology 18(6):065709-1-065709-5, Feb. 2007.
Ourmazd, a., et al., "Si—SiO2 Transformation: Interfacial Structure and Mechanism," Physical Review Letters 59(2):213-216, Jul. 1987.
Park, J.-H., et al., "Biodegradable Luminescent Porous Silicon Nanoparticles for in Vivo Applications," Nature: Materials 8(4):331-336, Apr. 2009.
Proot, J.P., et al., "Electronic Structure and Optical Properties of Silicon Crystallites: Application to Porous Silicon," Applied Physics Letters 61(16):1948-1951, Oct. 1992.
Puzzo, D.P., et al., "Visible Colloidal Nanocrystal Silicon Light-Emitting Diode," Nano Letters 11(4):1585-1590, Apr. 2011.
"Quantum LightTM Optic," QD Vision, Inc., Lexington, Mass., May 2010, <http://web.archive.org/web/20120808174638 /http://www.qdvision.com> [retrieved May 19, 2015], 5 pages.
Reboredo, F.A., and G. Galli, "Theory of Alkyl-Terminated Silicon Quantum Dots," Journal of Physical Chemistry B 109(3):1073-1078, Jan. 2005.
Resch-Genger, U., et al., "Quantum Dots Versus Organic Dyes as Fluorescent Labels," Nature: Methods 5(9):763-775, Sep. 2008.
Restuccia, K., "Troubled Mine Holds Hope for U.S. Rare Earth Industry," Washington Independent, Oct. 25, 2010, <http://web.archive.org/web/20140901110003/http://washingtonindependent.com> [retrieved May 19, 2015], 3 pages.
Sanderson, K., "Quantum Dots Go Large," Nature 459(7248):760-761, Jun. 2009.
Schiel, M., "Remote-Phosphor Technology Can Deliver a More Uniform and Attractive Light Output From LED Lamps," LEDS Magazine, Vol. 9, Issue 9, Sep. 2012, 12 pages.
Schlotter, P., et al., "Fabrication and Characterization of GaN/InGaN/AlGaN Double Heterostructure LEDs and Their Application in Luminescence Conversion LEDs," Materials Science and Engineering B59(1-3):390-394, May 1999.
Siemers, E., "Pacific Light Lands $3M for LED Technology," Portland Business Journal, May 4, 2012, <http://www.bizjournals.com/portland/blog/sbo/2012/05/pacific-light-lands-3m-forled.html>, [retrieved May 19, 2015], 3 pages.
Sieval, A.B., et al., "Highly Stable Si-C Linked Functionalized Monolayers on the Silicon (100) Surface," Langmuir 14(7):1759-1768, Mar. 1998.
Sigma-Aldrich, "CdSe/ZnS Quantum Dots," Specification Sheet, Product No. 731870, © 2015, <http://www.sigmaaldrich.com/catalog/product/aldrich/731870?lang=en&region=US>, [retrieved May 19, 2015], 2 pages.
Sykora, M., et al., "Size-Dependent Intrinsic Radiative Decay Rates of Silicon Nanocrystals at Large Confinement Energies," Physical Review Letters 1000(6):067401-1-067401-4, Feb. 2008.
Syvajarvi, M., et al., "Fluorescent SiC as a New Material for White LEDs," Physica Scripta T148:014002, 2012.
Timmerman, D., et al., "Step-Like Enhancement of Luminescence Quantum Yield of Silicon Nanocrystals," Nature: Nanotechnology 6(11)710-713, Nov. 2011.
Tu, C.-C., et al., "Brightly Photoluminescent Phosphor Materials Based on Silicon Quantum Dots With Oxide Shell Passivation," Optics Express 20(S1):A69-A74, Jan. 2012.

(56) References Cited

OTHER PUBLICATIONS

Tu, C.-C., et al., "Fluorescent Porous Silicon Biological Probes With High Quantum Efficiency and Stability," Optics Express 22(24):29996-30003, Dec. 2014.

Tu, C.-C., et al., "Red-Emitting Silicon Quantum Dot Phosphors in Warm White LEDs With Excellent Color Rendering," Optics Express 22(S2):A276—A281, Mar. 2014.

Tu, C.-C., et al., "Solution-Processed Photodetectors From Colloidal Silicon Nano/Micro Particle Composite," Optics Express 18(21):21622-21627, Oct. 2010.

Tu, C.-C., et al., "Surface Passivation Dependent Photoluminescence From Silicon Quantum Dot Phosphors,"Optics Letters 37(22):4771-4773, Nov. 2012.

Tu,C.-C., et al., "Visible Electroluminescence From Hybrid Colloidal Silicon Quantum Dot-Organic Light-Emitting Diodes," Applied Physics Letters 98(21):213102-1-213102-3, May 2011.

U.S. Department of Energy, "Roundtable Discussions on Recommended R&D Tasks for Solid-State Lighting," prepared for Lighting Research and Development, Building Technologies Program, Office of Energy Efficiency and Renewable Energy by Bardsley Consulting; Navigant Consulting, Inc.; Radcliffe Advisors, Inc.; SB Consulting; and Solid State Lighting Services, Inc., Dec. 2012, 47 pages.

U.S. Department of Energy, "Solid-State Lighting Research and Development: Manufacturing Roadmap," prepared for Lighting Research and Development, Building Technologies Program, Office of Energy Efficiency and Renewable Energy by Bardsley Consulting; Navigant Consulting, Inc.; Radcliffe Advisors, Inc.; SB Consulting; and SSLS, Inc., Jul. 2011, 79 pages.

U.S. Department of Energy, "Solid-State Lighting Research and Development: Multi-Year Program Plan," prepared for Lighting Research and Development, Building Technologies Program, Office of Energy Efficiency and Renewable Energy by Bardsley Consulting; Navigant Consulting, Inc.; Radcliffe Advisors, Inc.; SB Consulting; and Solid State Lighting Services, Inc., Apr. 2012, 137 pages.

Valenta, J., et al., "Light-Emission Performance of Silicon Nanocrystals Deduced From Single Quantum Dot Spectroscopy," Advanced Functional Materials 18(18):2666-2672, Sep. 2008.

Veinot, J.G.C., "Synthesis, Surface Functionalization, and Properties of Freestanding Silicon Nanocrystals," Chemical Communications 40:4160-4168, Oct. 2006.

Veiseh, M., et al., "Tumor Paint: A Chlorotoxin:Cy5.5 Bioconjugate for Intraoperative Visualization of Cancer Foci," Cancer Research 67(14):6882-6889, Jul. 2007.

Wang, X, et al., "Non-Blinking Semiconductor Nanocrystals," Nature 459(7247):686-689, Jun. 2009.

Warner, J.H., et al., "Water-Soluble Photoluminescent Silicon Quantum Dots," Angewandte Chemie International Edition 44(29):4550-4554, Jul. 2005.

Whitaker, T., "LED Market Grew Almost 10% in 2011, With 44% Growth in Lighting," LEDs Magazine, Feb. 2012 <http://www.ledsmagazine.com/articles/2012/02/led-market-grew-almost-10-in-2011-with-44-growth-in-lighting.html> [retrieved May 19, 2015], 8 pages.

Wolkin, M.V., et al., "Electronic States and Luminescence in Porous Silicon Quantum Dots: The Role of Oxygen," Physical Review Letters 82(1):197-200, Jan. 1999.

Yamani, Z., et al., "Ideal Anodization of Silicon," Applied Physics Letters 70(25):3404-3407, Jun. 1997.

Averboukh, B., et al., "Luminescence Studies of a Si/SiO2 Superlattice," Journal of Applied Physics 92(7):3564-3568, Oct. 2002.

Bae, W.K., et al., "Highly Efficient Green-Light-Emitting Diodes Based on CdSe@ZnS Quantum Dots with a Chemical-Composition Gradient," Advanced Materials 21(17):1690-1694, May 2009.

Belomoin, G., et al., "Oxide and Hydrogen Capped Ultrasmall Blue Luminescent Si Nanoparticles," Applied Physics Letters 77(6):779-781, Aug. 2000.

Bradsher, K., "Mitsubishi Quietly Cleans Up Its Former Refinery," The New York Times, Mar. 8,2011, <http://web.archive.org/web/20150408021310/http://www.nytimes.com/2011/03/09/business/energy-environment/09rareside.html> [retrieved May 19, 2015], 7 pages.

Buriak, J.M., "Organometallic Chemistry on Silicon and Germanium Surfaces," Chemical Reviews 102(5):1271-1308, May 2002.

Chen, H.-S., et al., "InGaN-CdSe-ZnSe Quantum Dots White LEDs," IEEE Photonics Technology Letters 18(1):193-195, Jan. 2006.

Cheng, K.-Y., et al., "High-Efficiency Silicon Nanocrystal Light-Emitting Devices," Nano Letters 11(5):1952-1956, May 2011.

Cheng, X., et al., "Colloidal Silicon Quantum Dots: From Preparation to the Modification of Self-Assembled Monolayers (SAMs) for Bio-Applications," Chemistry Society Reviews 43(8):2680-2700, Apr. 2014.

Cho, K.-S., et al., "High-Performance Crosslinked Colloidal Quantum-Dot Light-Emitting Diodes," Nature: Photonics 3(6):341-345, Jun. 2009.

Chung, W., et al., "YAG and CdSe/ZnSe Nanoparticles Hybrid Phosphor for White LED With High Color Rendering Index," Materials Chemistry and Physics 126(1-2):162-166, Mar. 2011.

Credo, G.M., et al., "External Quantum Efficiency of Single Porous Silicon Nanoparticles," Applied Physics Letters 74(14):1978-1980, Apr. 1999.

Cruz, R.A., et al., "Quantum Yield Excitation Spectrum (UV-Visible) of CdSe/ZnS Core-Shell Quantum Dots by Thermal Lens Spectrometry," Journal of Applied Physics 107(8):083504-1-083504-6, Apr. 2010.

Cullis, A.G. and L.T. Canham, "Visible Light Emission Due to Quantum Size Effects in Highly Porous Crystalline Silicon," Nature 353(6342):335-353, Sep. 1991.

Cullis, A.G., et al., "The Structural and Luminescence Properties of Porous Silicon," Journal of Applied Physics 82(3):909-965, Aug. 1997.

Davis, W., and Y. Ohno, "Color Quality Scale," Optical Engineering 49(3):033602-1-033602-16, Mar. 2010.

Derfus, A.M., et al., "Probing the Cytotoxicity of Semiconductor Quantum Dots," Nano Letters 4(1):11-18, Jan. 2004.

Ding, Z., et al., "Electrochemistry and Electrogenerated Chemiluminescence From Silicon Nanocrystal Quantum Dots," Science 296(5571):1293-1297, May 2002.

Dohnalovà, K., et al., "Surface Brightens Up Si Quantum Dots: Direct Bandgap-Like Size-Tunable Emission," Light: Science & Applications 2(2):2-6, Jan. 2013.

Dohnalovà, K., et al., "Time-Resolved Photoluminescence Spectroscopy of the Initial Oxidation Stage of Small Silicon Nanocrystals," Applied Physics Letters 94(21):211903-1-211903-3, May 2009.

Erdem, T., and H.V. Demir, "Semiconductor Nanocrystals as Rare-Earth Alternatives," Nature: Photonics 5(3):126, Mar. 2011.

Erogbogbo, F., et al., "Biocompatible Luminescent Silicon Quantum Dots for Imaging of Cancer Cells," ACS Nano 2(5):873-878, May 2008.

Erogbogbo, F., et al., "Bioconjugation of Luminescent Silicon Quantum Dots for Selective Uptake by Cancer Cells," Bioconjugate Chemistry 22(6):1081-1088, Jun. 2011.

Fujioka, K., et al., "Luminescent Passive-Oxidized Silicon Quantum Dots as Biological Staining Labels and Their Cytotoxicity Effects at High Concentration," Nanotechnology 19(41):415102-1-415102-7, Oct. 2008.

Gerion, D., et al., "Synthesis and Properties of Biocompatible Water-Soluble Silica-Coated CdSe/ZnS Semiconductor Quantum Dots," Journal of Physical Chemistry 105(37):8861-8871, Sep. 2001.

Godefroo, S., et al., "Classification and Control of the Origin of Photoluminescence From Si Nanocrystals," Nature: Nanotechnology 3(3):174-178, Mar. 2008.

Graydon, 0., "Shocking Observation," Nature: Photonics 5(7):386, Jul. 2011.

Guerra, R., et al., "Size, Oxidation, and Strain in Small Si1Si02 Nanocrystals," Physical Review B 80(15):155332-1-155332-5, Oct. 2009.

Heath, J.R., "A Liquid-Solution-Phase Synthesis of Crystalline Silicon," Science 258(5085):1131-1134, Nov. 1992.

Heinrich, J.L., "Luminescent Colloidal Silicon Suspensions From Porous Silicon," Science 255(5040):66-68, Jan. 1992.

(56) References Cited

OTHER PUBLICATIONS

Henderson, E.J., et al., "Influence of $HSi_{1\#5}$ Sol-Gel Polymer Structure and Composition on the Size and 181 Luminescent Properties of Silicon Nanocrystals," Chemical Materials 21(22):5426-5434, Nov. 2009.

Holmes, J.D., et al., "Highly Luminescent Silicon Nanocrystals With Discrete Optical Transitions," Journal of the American Chemical Society 123(16):3743-3748, Apr. 2001.

Huang, C.-J., et al., "Controlled Hierarchical Architecture in Surface-Initiated Zwitterionic Polymer Brushes With Structurally Regulated Functionalities," Advanced Materials 24(14):1834-1837, Apr. 2012.

Humphries, M., "Rare Earth Elements: The Global Supply Chain," CRS Report for Congress, Congressional Research Service, Sep. 6, 2011, 30 pages.

Jang, E., et al., "White-Light-Emitting Diodes With Quantum Dot Color Converters for Display Backlights," Advanced Materials 22(28):3076-3080, Jul. 2010.

Jang, H.S., et al., "White Light-Emitting Diodes With Excellent Color Rendering Based on Organically Capped CdSe Quantum Dots and $Sr_3SiO_5:Ce^{3+},Li^+$ Phospors," Advanced Materials 20(14):2696-2702, Jul. 2008.

Jansen, M., "Take a Comprehensive System View When Considering Remote Phosphor," LEDs Magazine, vol. 9, Issue 9, Sep. 2012, 8 pages.

"Jones Milestone Achievement Awards/Foster Accelerator," Foster School of Business, University of Washington, 2012, [retrieved May 9, 2013], 1 page.

Jurbergs, D., et al., "Silicon Nanocrystals With Ensemble Quantum Yields Exceeding 60%," Applied Physics Letters 88(23):233116-1-233116-3, Jun. 2006.

Kang, Z., et al., "A Polyoxometalate-Assisted Electrochemical Method for Silicon Nanostructures Preparation: From Quantum Dots to Nanowires," Journal of the American Chemical Society 129(17):5326-5327, May 2007.

Koch, F., and V. Petrova-Koch, "Light From Si-Nanoparticle Systems—A Comprehensive View," Journal of Non-Crystalline Solids 198-200(Pt. 2):840-846, May 1996.

Kovalev, D., et al., "Optical Properties of Si Nanocrystals," physica status solidi (b) 215(2):871-932, Oct. 1999.

Kusova, K., et al., "Brightly Luminescent Organically Capped Silicon Nanocrystals Fabricated at Room Temperature and Atmospheric Pressure," ACS Nano 4(8):4495-4504, Aug. 2010.

Lauerhaas, J.M., and M.J. Sailor, "Chemical Modification of the Photoluminescence Quenching of Porous Silicon," Science 261(5128):1567-1568, Sep. 1993.

Leung, M., "Fair Comparison of White LEDs and Remote Phosphor Guides Design Choice," LEDs Magazine, vol. 9, Issue 7, Jul. 2012, 12 pages.

Li, Q.S., et al., "Optimal Surface Functionalization of Silicon Quantum Dots," Journal of Chemical Physics 128(24):244714-1-244714-5, Jun. 2008.

Li, X., et al., "Process for Preparing Macroscopic Quantities of Brightly Photoluminescent Silicon Nanoparticles With Emission Spanning the Visible Spectrum," Langmuir 19(20):8490-8496, Sep. 2003.

Li, X., et al., "Surface Functionalization of Silicon Nanoparticles Produced by Laser-Driven Pyrolysis of Silane Followed by HF-$HNO_3$ Etching," Langmuir 20(11):4720-4727, May 2004.

Li, Y.Q., et al., "Luminescence Properties of Red-Emitting $M_2Si_5N_8:Eu^{2+}$ (M=Ca, Sr, Ba) LED Conversion Phosphors," Journal of Alloys and Compounds 47(1-2):273-279, Jun. 2006.

Li, Z.F., and E. Ruckenstein, "Water-Soluble Poly(acrylic acid) Grafted Luminescent Silicon Nanoparticles and Their Use as Fluorescent Biological Staining Labels," Nano Letters 4(8):1463-1467, Aug. 2004.

Liu, S.-M., et al., "Synthesis of Luminescent Silicon Nanopowders Redispersible to Various Solvents," Langmuir 21(14):6324-6329, Jul. 2005.

\* cited by examiner

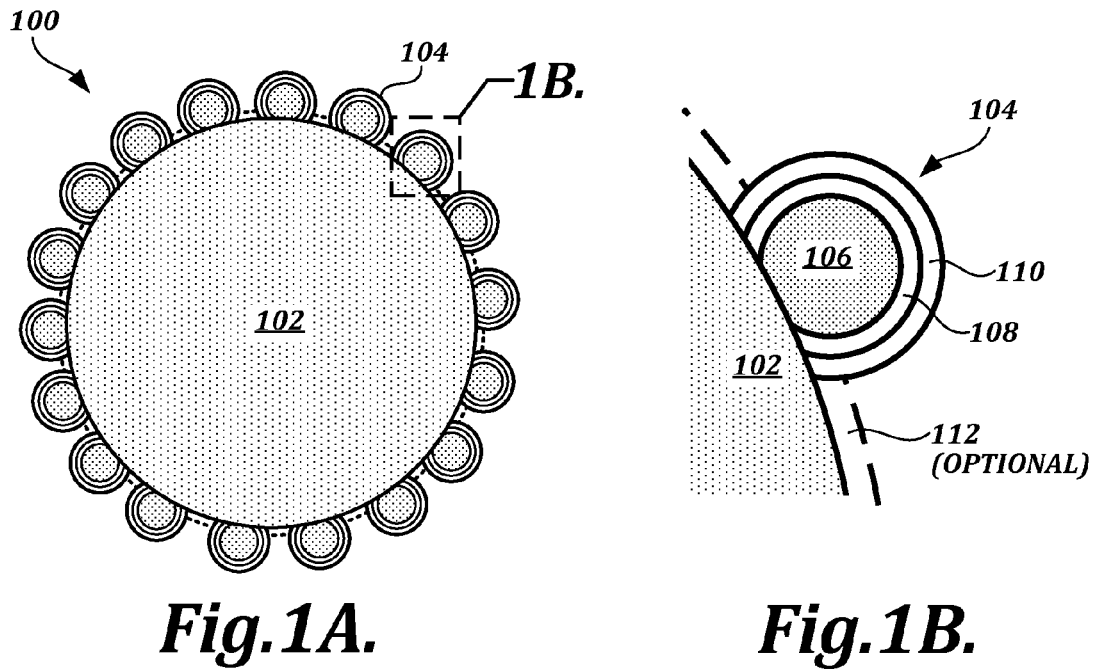
Fig.1A.
Fig.1B.
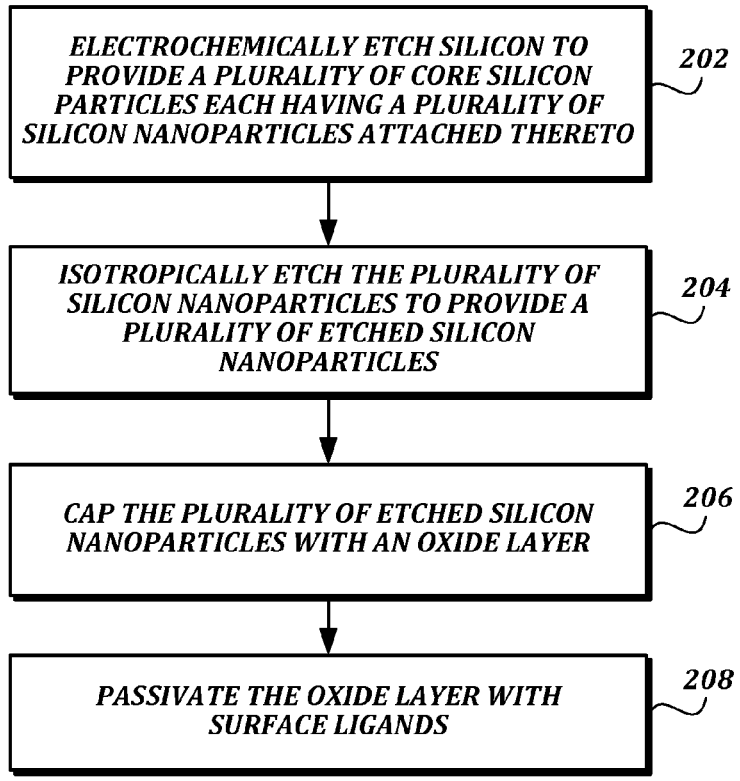
Fig.1C.

SURFACE-PASSIVATED SILICON QUANTUM DOT PHOSPHORS

CROSS-REFERENCE TO RELATED APPLICATION

This application claims the benefit of U.S. patent application Ser. No. 61/564,947, filed Nov. 30, 2011, the disclosure of which is hereby incorporated by reference in its entirety.

STATEMENT OF GOVERNMENT LICENSE RIGHTS

This invention was made with Government support under contract ECCS-0925378 and DMR 1035196 awarded by the National Science Foundation. The Government has certain rights in the invention.

BACKGROUND

Semiconductor quantum dots (QDs) with size-tunable band gaps, high photoluminescence (PL) quantum efficiency (QE), and high color purity have shown a great potential for next-generation lighting and displays. Light-emitting devices embodied by QDs have two general forms: First, hybrid QD-organic light-emitting diodes (LEDs), which utilize QDs as the electroluminescent layer while the organic semiconductor layers are responsible for electron-hole injection. Second, light-converting LEDs, in which QDs are excited by wide band gap LEDs and emit the desired PL in longer wavelengths. Recently, using a state-of-the-art white QD-LED backlight system composed of InGaN blue LEDs and multiply-passivated green- and red-light-emitting QDs as light converters, a high performance LCD panel was successfully demonstrated for the first time. However, it is worthy of notice that previous QD-light-emitting research was predominantly based on group II-VI semiconductor QDs, such as CdSe, CdZnSe or CdZnS cores with single or multiple shells. Although such complex and exquisite hetero-structures often lead to outstanding specifications, for instance almost 100% PL QE, however, the high synthesis cost and the toxicity from their heavy-metal ingredients might shadow their potential for large-scale production and wide-spread commercialization.

Group IV silicon QDs (SiQDs), on the other hand, have gradually received more attention, owing to their heavy-metal-free composition, chemical stability and abundant starting materials. Recently, hybrid SiQD-organic LEDs have demonstrated electroluminescence from infra-red (IR) to visible wavelengths. Extensive works have been contributed to the synthesis of SiQDs. To date, main strategies include solution-based precursor reduction, heat-, laser- or plasma-induced aerosol decomposition of $SiH_4$, thermal processing of sol-gel polymers derived from $HSiCl_3$ and harvesting from nano-porous silicon. Except the last one, all the other methods inevitably require critical conditions, special equipment or complex chemical reactions, all of which make them hard to achieve cost-down and scale-up. In contrast, porous silicon can be easily prepared by electrochemical etching in a mixture of common chemicals under ambient condition. The subsequent physical harvesting can effectively separate the SiQDs from the silicon substrate. Noticeably, these highly luminescent powders mostly comprise micro-size silicon pieces with PL-emitting nanocrystal SiQDs trapped on their surfaces, rather than free-standing SiQDs.

Despite recent advances, if silicon-based phosphors are to be used in lighting devices, improvements in the phosphor materials themselves, as well as the methods for making the phosphors, must be achieved.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one aspect, a silicon phosphor is provided. In one embodiment, the silicon phosphor includes:

a core comprising a silicon particle;

a plurality of silicon nanoparticles attached to the core;

a silicon oxide layer substantially encapsulating each of the plurality of silicon nanoparticles; and a passivating layer comprising a plurality of passivating ligands bound to the silicon oxide layer.

In another aspect, a method of making silicon phosphors is provided. In one embodiment, the method comprises the steps of:

(a) electrochemically etching silicon to provide a plurality of core silicon particles each having a plurality of silicon nanoparticles attached thereto;

(b) isotropically etching the plurality of silicon nanoparticles to provide a plurality of etched silicon nanoparticles;

(c) capping the plurality of etched silicon nanoparticles with an oxide layer; and (d) passivating the oxide layer with surface ligands.

In another aspect, a lighting device is provided that incorporates a silicon phosphor as described herein.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 1A and 1B are diagrammatic illustrations of silicon phosphors in accordance with the disclosed embodiments.

FIG. 1C is a flow chart illustrating a method for making silicon phosphors in accordance with the disclosed embodiments.

DETAILED DESCRIPTION

Figure 2A:
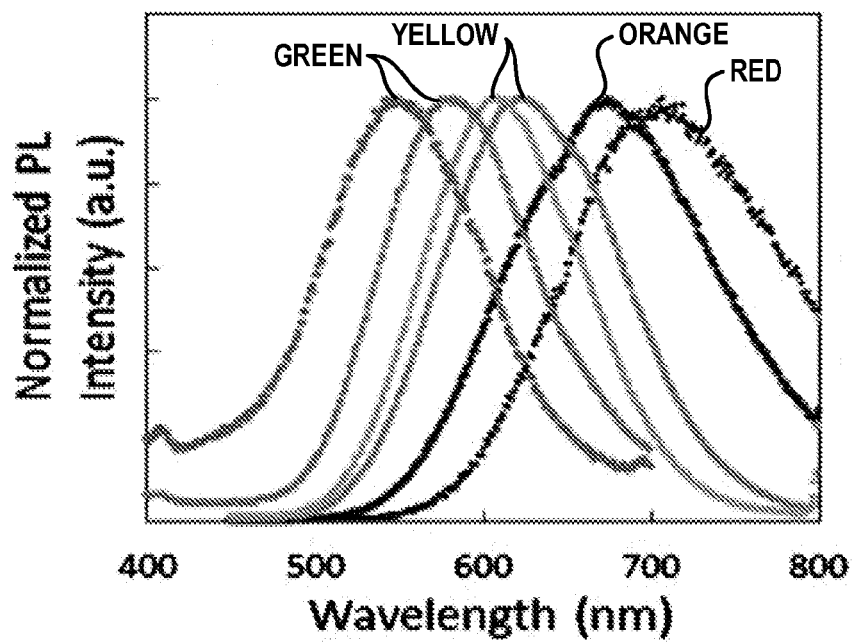
FIGS. 2A-2C. (2A) The normalized PL spectra of near-IR-, red-, orange-, yellow-, yellow-green-, and green-light-emitting colloidal SiQD-based phosphor materials in ethanol. (2B) The normalized excitation spectra of the red-, orange-, yellow-, and yellow-green-light-emitting phosphors measured in (2A). (2C) The PL spectra and EQEs of the red-light-emitting phosphors passivated with hydrides, hydroxyl groups and TMPS.

Phosphors formed using silicon nanoparticles are provided. The phosphors exhibit bright fluorescence and high quantum yield, making them ideal for lighting applications. Methods for making the silicon phosphors are also provided, along with lighting devices that incorporate the silicon phosphors.

In one aspect, a silicon phosphor is provided. In one embodiment, the silicon phosphor includes:
a core comprising a silicon particle;
a plurality of silicon nanoparticles attached to the core;
a silicon oxide layer substantially encapsulating each of the plurality of silicon nanoparticles; and
a passivating layer comprising a plurality of passivating ligands bound to the silicon oxide layer.

The silicon phosphor is capable of photoluminescence. Particularly, the silicon phosphor absorbs light in a particular wavelength range and emits light in a relatively lower-energy wavelength range. For example, in one embodiment, the silicon phosphor absorbs UV light and emits visible red light.

Phosphors have many uses in lighting applications. The provided silicon phosphors can be readily substituted for traditional phosphors using methods known to those of skill in the art.

The silicon phosphor may be better understood with reference to FIGS. 1A and 1B. A silicon phosphor 100 is illustrated that comprises a core 102 and a plurality of nanoparticles 104. The plurality of nanoparticles 104 can be seen in detail in FIG. 1B, wherein each nanoparticle 104 includes a silicon nanoparticle 106 substantially encapsulated with an oxide layer 108. The oxide layer 108 is passivated (i.e., coated) with a plurality of passivating ligands 110. Depending on the method by which the silicon phosphor 100 is fabricated, an oxide layer 112 may grow on surface of the core 102 in addition to the silicon nanoparticle 106. Similarly, a layer of passivating ligands may also coat the surface of the optional oxide layer 112. However, such optional coatings are incidental to the functionality of the silicon phosphor 100, which uses the oxide layer 108 and passivating ligands 110 to control the emission characteristics of the nanoparticles 104. The core 102 does not have emission characteristics and only serves to quench and/or scatter light impinging on its surface.

The core of the silicon phosphor is formed from a silicon particle. The silicon particle may be single-crystalline or polycrystalline. In one embodiment, the core has a diameter of between about 10 nm and about 10 µm.

Depending on the size of the core certain wavelengths of light may be scattered. Such scattering can be beneficial in lighting applications where it is desirable to disperse light. In one embodiment, the core is capable of scattering UV, visible, and infrared light. In one embodiment, the core is only capable of scattering visible light.

A plurality of silicon nanoparticles are attached to the core. By "attached to the core" it meant that the silicon nanoparticles are immobilized on the surface of the core. This may be by bonding, electrostatic, or other means known to those of skill in the art. The attachment must be robust enough such that the silicon phosphors do not dissemble when in solution. The silicon nanoparticles are single-crystalline. Single-crystalline silicon nanoparticles produce the highest photoluminescent quantum yield. In one embodiment, the plurality of silicon nanoparticles each has a diameter between 1 nm and 5 nm.

The size of the silicon nanoparticles largely defines the absorption and emission qualities of the silicon phosphor. In this regard, the silicon nanoparticles are "quantum dots" (QDs), a term that is well known to those of skill in the art.

In one embodiment, the plurality of silicon nanoparticles partially covers the core. In another embodiment, the plurality of silicon nanoparticles completely covers the core (i.e., forms a continuous layer of silicon nanoparticles in a shell around the core).

The silicon nanoparticles are each substantially encapsulated by a silicon oxide layer. The oxide layer is not an atmospheric oxide, but is instead an intentionally-grown oxide formed in solution or high-temperature oxidation. The oxide layer serves to enhance the photoluminescent qualities of the silicon phosphor. The oxide layer is typically 1 nanometer or greater in thickness.

As used herein the term "substantially encapsulated" means that the silicon nanoparticle is encapsulated by the oxide on every surface that is exposed to the environment surrounding the silicon nanoparticle. Depending on the attachment mechanism between the core and the silicon nanoparticle, a portion of the silicon nanoparticle may abut the core and therefore would not be oxidized. Such an arrangement is illustrated in FIG. 1B.

The oxide layer of each silicon nanoparticle is covered by a passivating layer. The passivating layer is a plurality of passivating ligands covalently bound to the oxide (e.g., via a siloxane bond). The passivating layer further enhances the photoluminescent qualities of the silicon phosphor. The ligands are referred to as "passivating" because they protect the emitting silicon nanoparticles from photoluminescence-quenching molecules, such as water or ethanol, and enable stable suspension in the desired solvent systems.

In one embodiment, the passivating ligand is selected from the group consisting of alkyls, alkenyls, alkynyls, aromatics, aromatic heterocycles, conjugated aromatics, polyenes, cyanides, hydroxys, alkoxys, carboxylates, phenoxys, siloxys, cyanates, thioalkyls, thioaryls, thiocyanates, silylthios, substituted silyl groups, amino groups, mono-substituted amines, di-substituted amines, imino groups, silylaminos, alkoxy silanes, alkyl alkoxysilanes, and amino alkoxysilanes.

In one embodiment, the plurality of passivating ligands includes trimethoxypropylsilanes (TMPS). In one embodiment, the plurality of passivating ligands includes (3-aminopropyl)trimethoxysilanes (APTS).

In another aspect, a method of making silicon phosphors is provided. In one embodiment, the method comprises the steps of:

(a) electrochemically etching silicon to provide a plurality of core silicon particles each having a plurality of silicon nanoparticles attached thereto;

(b) isotropically etching the plurality of silicon nanoparticles to provide a plurality of etched silicon nanoparticles;

(c) capping the plurality of etched silicon nanoparticles with an oxide layer; and (d) passivating the oxide layer with surface ligands.

The method is illustrated as a flow chart in FIG. 1C.

In the first step 202, silicon is electrochemically etched to provide a plurality of core silicon particles each having a plurality of silicon nanoparticles attached thereto. Referring back to FIG. 1B, this step essentially provides a core 102 with nanoparticles 106 attached to the surface. This step can be accomplished using electrochemical etching techniques known to those of skill in the art. Further specific examples are set forth in the EXAMPLES below. In one embodiment, the silicon is electrochemically etched in a solution of HF and methanol. In one embodiment, the silicon is a silicon wafer that is submerged and disposed horizontally in the etching solution.

The silicon may be doped or undoped. In one embodiment, the silicon is a p-type silicon wafer. In another embodiment, the silicon is an n-type silicon wafer.

When a silicon wafer is used for the electrochemical etching step, the plurality of silicon nanoparticles are obtained from the wafer surface by mechanically pulverizing the electrochemically etched silicon.

In the second step 204, the plurality of silicon nanoparticles is isotropically etched to provide a plurality of etched silicon nanoparticles. The etching is typically performed using a solution configured to isotropically etch silicon. In one embodiment, the plurality of silicon nanoparticles are isotropically etched in an aqueous solution comprised of $HNO_3$ and HF.

The isotropic etch is performed at a controlled rate so as to reduce the size of the silicon nanoparticles to a desired level and to homogenize the surface states of the particles, which enhances photoluminescence.

In the third step 206, the plurality of etched silicon nanoparticles are capped with an oxide layer. The oxide layer is grown using a solution-based technique, such as $HNO_3$ or other acids known to those of skill in the art. The thickness of the oxide is greater than the thickness of an oxide grown atmospherically at room temperature (i.e., a native oxide). In one embodiment, the oxide is 1 nm or greater in thickness.

In the fourth step 208, the oxide-encapsulated silicon nanoparticles are passivated with surface ligands. The surface ligands covalently bond to the oxide and enhance photoluminescence.

In one embodiment, the passivating ligand is selected from the group consisting of alkyls, alkenyls, alkynyls, aromatics, aromatic heterocycles, conjugated aromatics, polyenes, cyanides, hydroxys, alkoxys, carboxylates, phenoxys, siloxys, cyanates, thioalkyls, thioaryls, thiocyanates, silylthios, substituted silyl groups, amino groups, mono-substituted amines, di-substituted amines, imino groups, silylaminos, alkoxy silanes, alkyl alkoxysilanes, and amino alkoxysilanes.

In one embodiment, the plurality of passivating ligands includes trimethoxypropylsilanes (TMPS). In one embodiment, the plurality of passivating ligands includes (3-aminopropyl)trimethoxysilanes (APTS).

In one embodiment, the method further comprises a step of separating the silicon phosphors into nano-scale silicon phosphors and micron-scale silicon phosphors. In a further embodiment, separating comprises centrifuging a solution of the silicon phosphors such that the micron-scale silicon phosphors sediment and the nano-scale silicon phosphors remain in a supernatant, wherein the method further comprises removing the supernatant comprising the nano-scale silicon phosphors. As described in EXAMPLE 1 below, separating relatively "larger" (i.e., 100 nm or greater in diameter) phosphors from "smaller" (i.e., 100 nm or less in diameter) phosphors can improve the photoluminescence of a solution containing only smaller phosphors.

In another aspect, a lighting device is provided that incorporates a silicon phosphor as described herein. The silicon phosphors can be utilized in any manner that conventional, known phosphors are used for lighting applications. Therefore, the silicon phosphors can be used with any compatible light source to provide a photoluminescent response. In one embodiment, the lighting device is selected from the group consisting of a light-emitting diode and a fluorescent lamp.

Figure 8A:
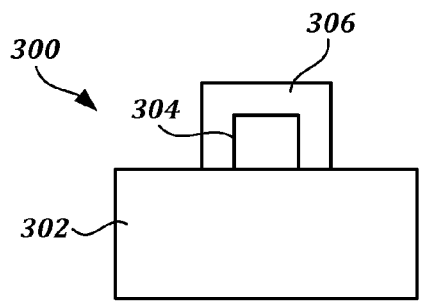
FIGS. 8A-8C are diagrammatic illustrations of embodiments of lighting devices incorporating silicon phosphors in accordance with the disclosed embodiments.

In one embodiment, the silicon phosphor is applied directly to a light source. In such an embodiment, the silicon phosphor may be excited by a UV, blue, or other "higher energy" wavelength. An illustrative embodiment is shown in FIG. 8A, in which a lighting element 300 includes a light source 304 (e.g., a LED) disposed on a substrate 302. As is known to those of skill in the art, the substrate 302 may include a reflective surface designed to direct light from the light source 304 in a particular direction. A layer of silicon phosphors 306, such as those provided herein, are disposed directly on the surface of the light source 304. When the light source 304 is illuminated, the silicon phosphors 306 convert light photoluminescence to alter the spectral output of the lighting element 300 compared to a similar lighting element with no silicon phosphors.

Figure 8B:
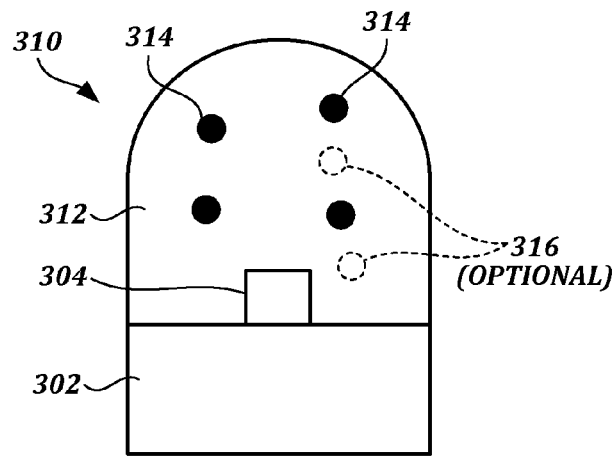

In one embodiment, the silicon phosphor is incorporated in a substantially optically translucent matrix placed adjacent to a blue or UV emitting light source. Such an embodiment is illustrated in FIG. 8B, which illustrates a lighting element 310 having a light source 304 on a substrate 302. A translucent matrix 312 is disposed contacting and surrounding the light source 302, as is typically used to package LEDs. Within the translucent matrix 312, silicon phosphors 314 as disclosed herein are disposed. Optionally, other phosphors and/or light diffusers 316 can be disposed in the translucent matrix 312 so as to further alter the spectral output of the lighting element 310.

Figure 8C:
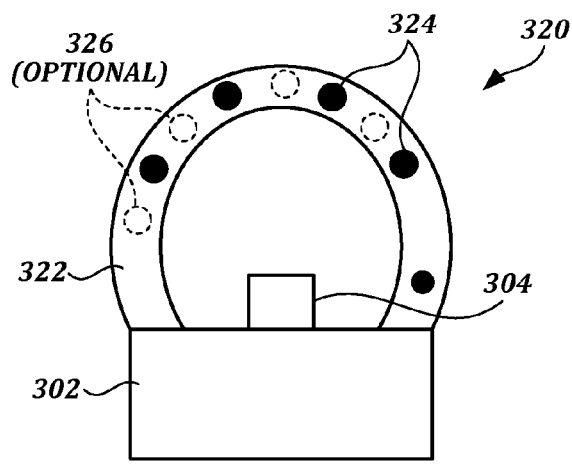

In one embodiment, the silicon phosphor is embedded on the surface of a bulb which encapsulates a light source. Such an embodiment is illustrated in FIG. 8C, which illustrates a lighting element 320 having a light source 304 on a substrate 302. A bulb 322 is disposed surrounding, but not abutting, the light source 302, as is typically found in bulb-based lighting (e.g., incandescent bulbs). Within the bulb 322, silicon phosphors 324 as disclosed herein are disposed. Optionally, other phosphors and/or light diffusers 326 can be disposed in the bulb 322 so as to further alter the spectral output of the lighting element 320.

In any of the provided embodiments, the silicon phosphors may be part of a lighting device that ultimately outputs white light via a combination of the spectral output of the lighting element, the silicon phosphors, and (optionally) other phosphors.

In one embodiment, the lighting device (e.g., 300, 310, or 320) is selected from the group consisting of a light-emitting diode and a fluorescent lamp.

The following examples are included for the purpose of illustrating, not limiting, the described embodiments.

EXAMPLES

Example 1

Silicon Quantum Dots Passivated with Trimethoxypropylsilane (TMPS)

Here we demonstrate low-cost, heavy-metal-free, air-stable and wavelength-tunable SiQD-based phosphor materials which are synthesized by the electrochemical etching method. Although containing micro-size particles, the colloidal red-light-emitting phosphors in chloroform exhibit PL external QE (EQE) of 15.9%. Furthermore, their thin films can be efficiently excited by InGaN LEDs and are stable in room condition owing to an oxide passivating shell. All these properties enable the SiQD-based phosphor materials a good candidate as light converters for lighting and display applications.

Experimental

We electrochemically etched p-type boron-doped Si wafers with (100) orientation and 5-20 ohm-cm resistivity in a mixture of HF and methanol. A typical etching condition was at a constant current density of 3.5 mA/cm$^2$ for about an hour under stirring. After rinsing with isopropanol and drying in air, the wafer surface exhibited bright orangish/reddish PL and became highly hydrophobic as a result of complete hydride termination (Si—H). By simply adjusting the electrolyte ratios, etching current density and etching time, the PL peak wavelength can vary from 710 nm to 650 nm after the electrochemical etching. The luminescent powders harvested from the wafer surface were then dispersed in ethanol uniformly with the help from ultra-sonication. For the synthesis of near-IR- to red-light-emitting phosphors, $HNO_3$ was slowly added to the Si powder suspension under stirring, resulting in a final concentration of 20%. For the synthesis of orange-, yellow-, and green-light-emitting phosphors, both $HNO_3$ and diluted HF were added to yield a final concentration of 20% for $HNO_3$ and 0.5-1% for HF. During the isotropic etching, the PL intensity gradually increased and the PL color continuously blue-shifted from red to orange, yellow, and green in the case of $HNO_3$/HF etching. Once the desired PL wavelength was reached, the reaction was effectively stopped by taking the suspension to centrifugation (4000 rpm for 20 minutes), decanting the supernatant and re-dispersing the precipitate in ethanol. The process can be repeated several times to remove residual $HNO_3$ and HF.

For further functionalization with alkoxysilanes, the luminescent silicon powders, treated as described above to obtain hydroxyl termination (Si—OH), were dispersed in ~5 wt % trimethoxypropylsilane (TMPS) in ethanol, and then refluxed with stirring for about 12 hours. Subsequently, the suspension was taken to centrifugation (4000 rpm for 20 minutes) and the precipitate can form a stable suspension in non-polar solvents, such as chloroform and hexanes. A typical concentration of 1 mg/ml was used for optical characterizations and 10 mg/ml for thin film fabrication. The PL and excitation spectra of all liquid samples were measured by using a fluorometer (Jobin Yvon Horiba Fluorolog FL-3) with xenon short arc lamp as light source. The PL EQE of all liquid and solid-state thin film samples were measured by using an integrating sphere system (Hamamatsu Absolute PL Quantum Yield Measurement System).

Results and Discussion

Figure 2B:
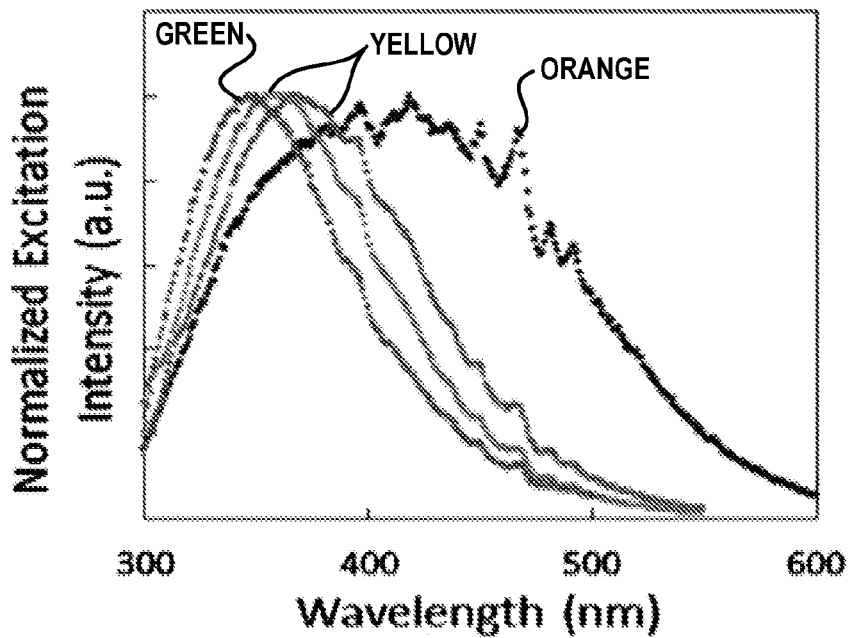

The normalized PL and excitation spectra of colloidal SiQD-based phosphors in ethanol are shown in FIGS. 2A and 2B, respectively. The PL of near-IR- (708 nm), red- (674 nm), orange- (624 nm), and yellow- (610 nm) light-emitting samples were measured with 405 nm excitation, while the PL of yellow-green- (585 nm) and green- (549 nm) light-emitting samples were measured with 365 nm excitation. Specifically, the red-light-emitting phosphors which were treated by $HNO_3$ have a broadband excitation spectrum, maintaining 70% of excitation efficiency from 345 nm to 475 nm (the red-line in FIG. 2B). Similar results were also observed for the near-IR-light-emitting phosphors. However, with $HNO_3$/HF etching, the orange-, yellow-, yellow-green-, and green-light-emitting phosphors can only be efficiently excited by a narrow band of ultra-violet (UV) light and the excitation spectra slightly blue-shift for the longer $HNO_3$/HF etching time. Note that several energy lines around 475 nm in the excitation spectra likely originate from the xenon lamp.

Figure 2C:
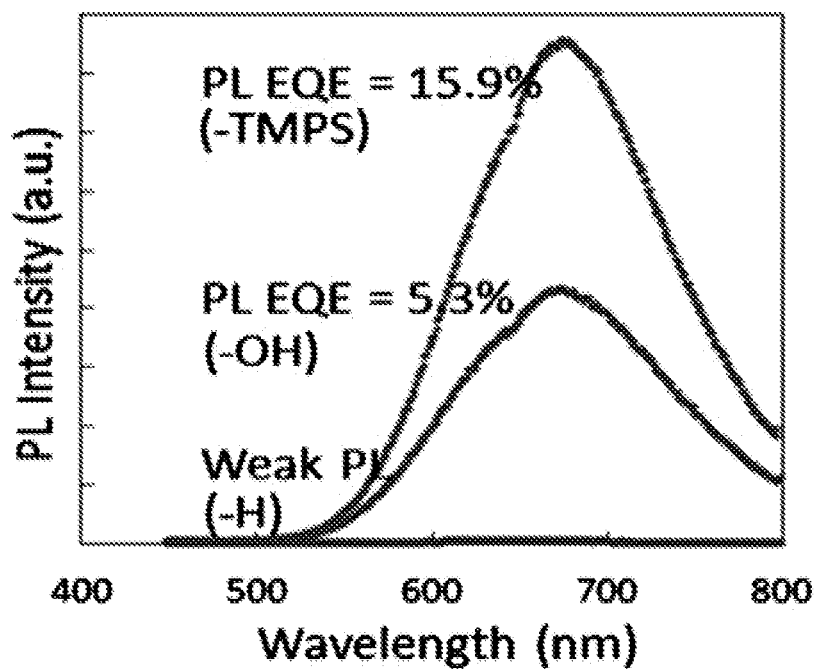

The PL spectra and EQEs of the colloidal red-light-emitting phosphor suspension with different kinds of surface passivation are shown in FIG. 2C. The electrochemical etching resulted in bright orangish/reddish PL on the wafer surface. However, after the fluorescent powders were suspended in ethanol, the PL intensity became significantly quenched. The PL quenching due to ethanol has also been observed in hydrogen-terminated porous silicon. The following $HNO_3$ treatment essentially grew a high-quality oxide capping which isolates the PL-emitting SiQDs from the environment. Experimentally, the enhancement of PL intensity in ethanol was clearly observed for samples treated by either $HNO_3$ only or a $HNO_3$/HF mixture. The PL EQE of red-, orange-, yellow-, and yellow-green-light-emitting phosphors in ethanol were measured to be 5.3%, 6.3%, 3.6% and 1.4%, respectively. (All samples were excited by 405 nm, except the yellow-green sample which was excited by 365 nm.) To improve solubility in non-polar solvents, the phosphor materials with hydroxyl termination reacted with alkoxysilanes (here we used TMPS) through the silanization reaction. In FIG. 2C, the TMPS-treated red-light-emitting phosphors in chloroform showed a much improved PL EQE of 15.9% (with 405 nm excitation). The improvement possibly arises from the higher degree of oxide capping as a result of reflux and the solvent environment changed from polar to non-polar systems. The PL peak wavelength slightly red-shifted (from 656 nm to 674 nm) from hydride to hydroxyl termination both in ethanol, while there was almost no change of PL peak position from hydroxyl termination in ethanol to alkyl termination in chloroform, as shown in FIG. 2C. Although containing a certain amount of micro-size silicon particles, the PL EQE (15.9%) achieved here is comparable to a recent result in literature (SiQD-ensemble PL QE of 20%). However, their synthesis required multiple sedimentation processes and the capping structures involved complex organic residues. To further improve the PL EQE, an efficient separation technique to harvest SiQDs from the wafer with high production yield has been investigated. After extended ultra-sonication and centrifugation, we obtained a clear red-light-emitting suspension containing only nano-size particles in ethanol, and the PL EQE of that sample was measured to be 9.4%, compared to 5.3% with both nano- and micro-size particles in ethanol.

Figure 3A:
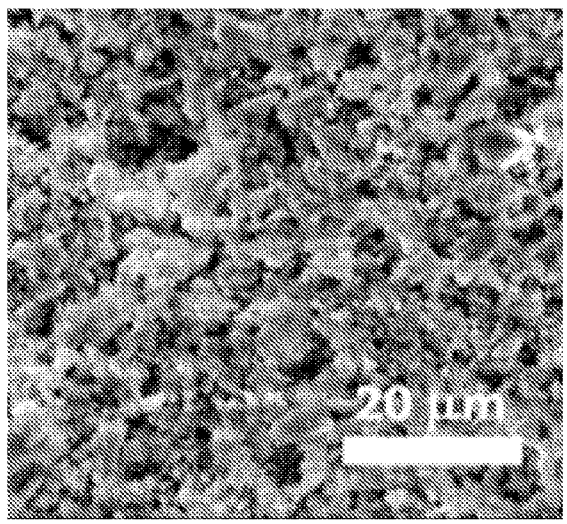
FIGS. 3A-3C. (3A) and (3B) The SEM images of a drop-casted phosphor thin film by low (103×) and high (105×) magnification, respectively. (3C) "UW" painted with the red-light-emitting phosphors on a glass slide.
Figure 3B:
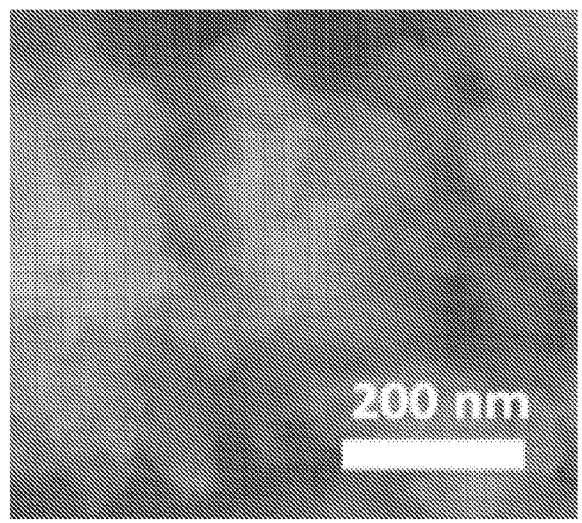
Figure 3C:
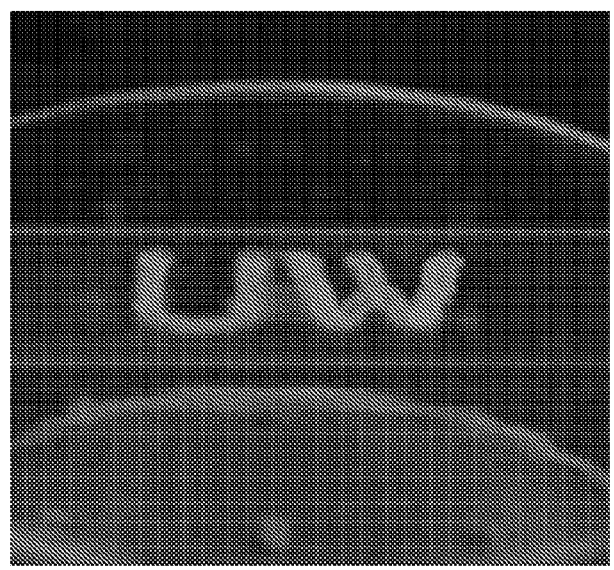

The red-light-emitting phosphors in non-polar solvents can be processed into thin films by drop-casting or spin-coating. FIGS. 3A and 3B show the scanning electron microscope (SEM) images of the thin film in low and high magnification, respectively. For the micro-size silicon particles, they are mostly of sizes ranging from 1 to 5 μm. Some submicron-size clusters can also be found among the gaps between particles. In high magnification, nano-porous surfaces which are mostly composed of PL-emitting SiQDs can be found on top of each micro-size silicon particle. FIG. 3C shows "UW" painted a glass slide by using the red-light-emitting phosphors suspending in hexanes/octanes. The photograph was taken under illumination from a 365 nm UV lamp.

Figure 4A:
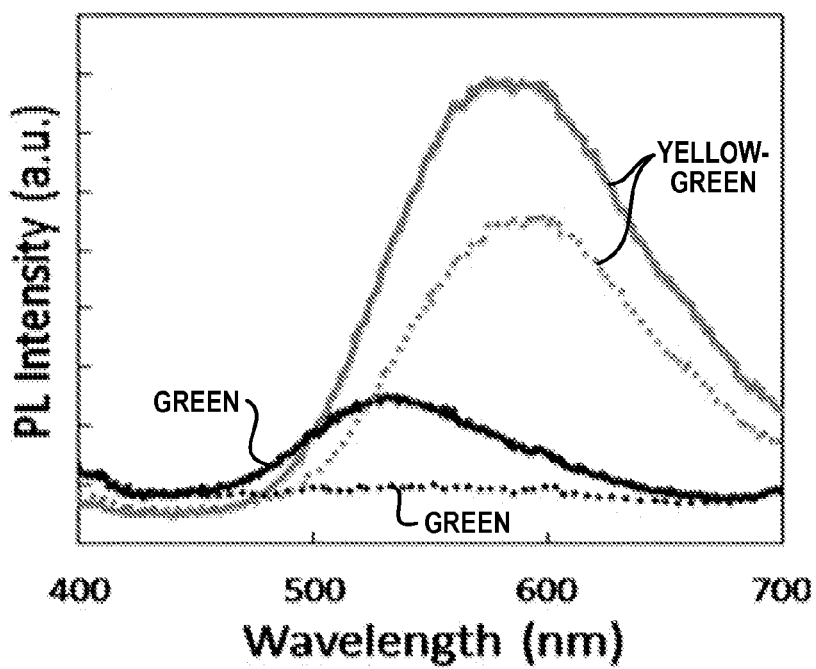
FIGS. 4A-4C. (4A) The PL spectra of colloidal green-light-emitting phosphors before (solid lines) and after oxidation (dot lines). (4B) The PL spectra of a mixture of colloidal red- and yellow-green-light-emitting phosphors, where the black- and grey-dot lines represent different mixing ratios. (4C) The light spectra from a 405 nm InGaN LED with the red-light-emitting phosphor thin film as light converters, as a function of increasing LED intensity (from the bottom-dash line to the top-solid line).

For applications in lighting and displays, the air-stability of all phosphor materials has been an important requirement. To verify such quality, the PL EQE of the red-light-emitting phosphor thin film, such as the one in FIG. 3C, was initially measured to be 13.2% (with 405 nm excitation), and it maintained more than 10% for the following two weeks when the thin film was stored in room condition. Meanwhile, the PL peak position also remained unchanged. This high stability likely arising from the oxide passivation was also found in near-IR-, orange-, and yellow-light-emitting samples. For yellow-green- and green-light-emitting phosphors whose PL peak at <590 nm, although capped with an oxide passivating shell, their PL peak wavelengths still slowly red-shifted toward yellow as exposed in air. This phenomenon is likely attributed to the electron- and hole-trap-states resulting from Si=O bonds which form localized energy levels in the bandgap of SiQDs and therefore red-shift the PL peak to around 590 nm. For example, in FIG. 4A, the PL peak of a colloidal phosphor suspension in ethanol (yellow-green-solid line) red-shifted from its original 583 nm to 590 nm upon oxidation by mixing with $H_2O_2$ (yellow-green-dot line). Noticeably, the PL peak intensity dropped about 30% at the same time. For comparison, the same colloidal phosphor suspension was first treated with diluted HF to remove the surface oxide passivation, then re-dispersed in ethanol (green-solid line), and mixed with $H_2O_2$ at the end (green-dot line). Upon HF treatment, the PL peak wavelength blue-shifted from its original 583 nm to 533 nm as a result of decreased QD size by HF etching, while the PL peak intensity also dropped about 70% likely due to ethanol quenching on the hydride-terminated surface. After adding $H_2O_2$, the PL dramatically disappeared due to the formation of efficient non-radiative channels. Similar results have been found in the previous study of porous silicon that poorly oxidized surface leads to catastrophic loss of PL, while high-quality oxide passivation formed chemically or thermally can enhance PL efficiency.

Figure 4B:
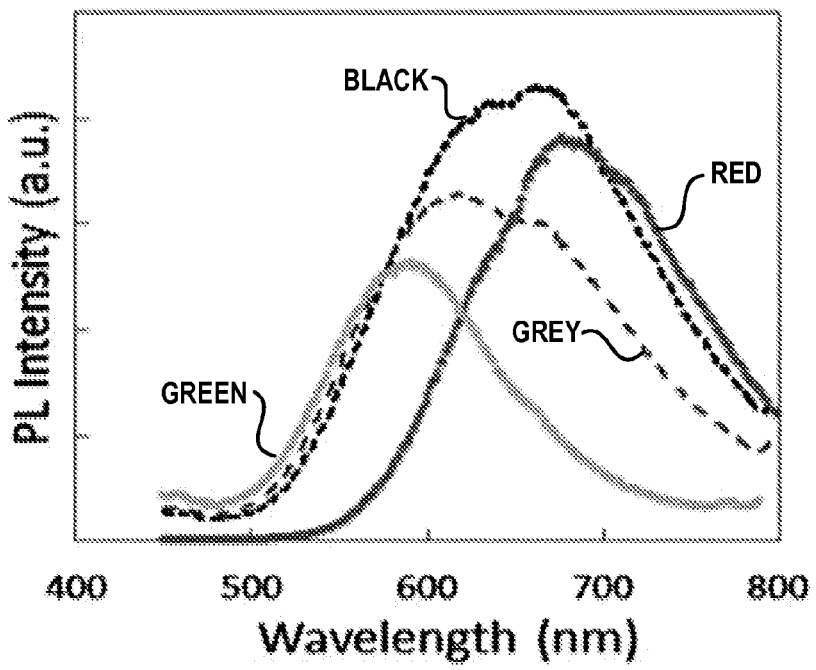
Figure 4C:
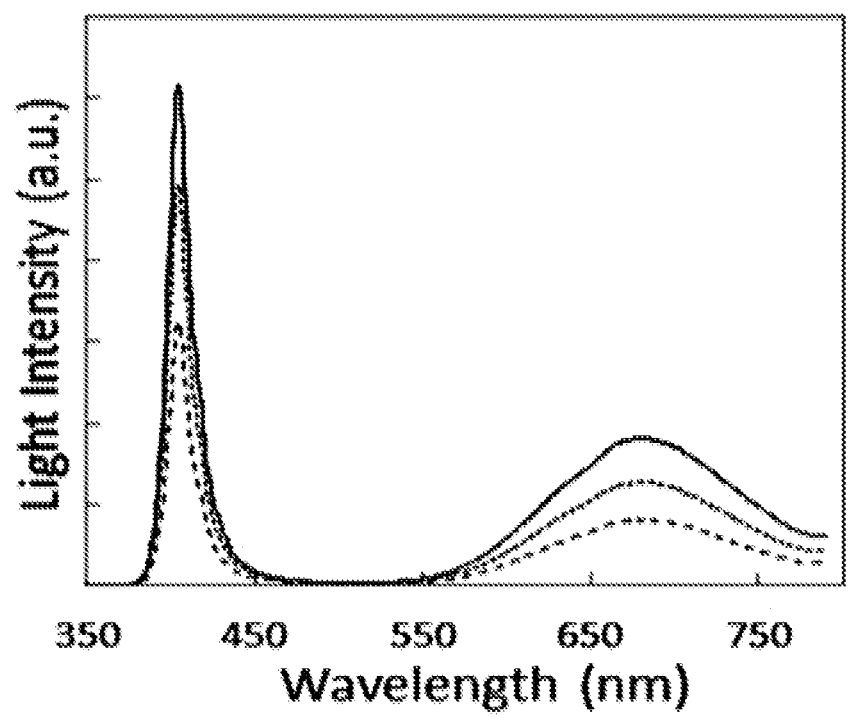

White light generation has drawn much attention owing to the expanding market of general lighting and backlight for liquid-crystal displays (LCDs). Mixing the light from a blue InGaN LED and that of yellow phosphors (cerium-doped yttrium aluminum garnet (YAG)) has been the most efficient and cost-effective way for obtaining a white LED. However, the resulting pale white light cannot display color faithfully due to a relatively small color gamut. As shown in FIG. 4B, here we demonstrate mixing colloidal yellow-green- (585 nm) and red- (677 nm) light-emitting SiQD-based phosphors to yield a yellow-to-orange broadband emission (full-width-at-half-maximum (FWHM)=181 nm). By mixing with more colors especially in the blue to green wavelengths, the phosphor materials can potentially generate continuous emission covering the whole visible spectrum for the general lighting application. Furthermore, to demonstrate the integration with conventional LEDs, FIG. 4C shows the light spectra from a 405 nm InGaN LED (purchased from Thorlabs, Inc.) with the red-light-emitting phosphor thin film as light converters, as a function of increasing LED intensity. Similar demonstration of using CdSe/ZnSe QDs as light converters in comparison with conventional YAG phosphors was found in literature. To achieve a white LED consisting of a blue LED with red and green SiQD-based phosphors as three primary colors, the low excitation efficiency of green phosphors in blue wavelengths is now the main obstacle, as shown in FIG. 2B. The studies of green phosphors of higher blue excitation efficiency and better passivation to prevent PL red-shifting due to Si=O trap-states are currently in progress.

To determine the effect of micron-size Si particles in quenching PL quantum yield (QY), we took a suspension comprising both micron-sized and nano-sized silicon quantum dot phosphors passivated with TMPS to centrifugation and collected the supernatant. Under room lighting, the phosphor suspension before centrifugation looked "muddy" because the micron-size Si particles enhance light scattering and trapping inside the solution. The phosphor suspension after centrifugation became optically transparent with slightly yellowish color. Under 365-nm UV excitation, both samples showed bright red-emitting PL and the same PL spectrum. However, the PL QY of the sample after centrifugation increased to 37%, compared to 16% before centrifugation.

Conclusion

In summary, we have demonstrated colloidal SiQD-based phosphor materials which emitted bright PL from near-IR to green. The phosphors were first synthesized by the electrochemical etching method. The subsequent $HNO_3$ or $HNO_3$/HF isotropic etching not only controlled the QD size so as to the PL emission due to quantum confinement effect, but also capped the material surface with a high-quality oxide passivating shell. The red-light-emitting phosphors with $HNO_3$ treatment can be efficiently excited by blue light, while the other phosphors with $HNO_3$/HF treatment can be excited by a relatively narrow band in UV. The phosphor materials with hydroxyl termination can further react with alkoxysilanes to become stable suspensions in non-polar solvents. The TMPS-modified red-light-emitting phosphors in chloroform showed PL EQE of 15.9%, and their thin films are stable in room condition (PL EQE equal to 13.2% initially and kept more than 10% for two weeks). The SiQD-based phosphor materials presented here have shown a great potential as low-cost, heavy-metal-free, air-stable, and wavelength-tunable light-converters for applications in general lighting and display backlight systems.

Example 2

Silicon Quantum Dots Passivated with (3-aminopropyl)triethoxysilane (APTES)

Semiconductor quantum dots (QDs) with wide-range wavelength-tunability, high photoluminescence (PL) quantum yield (PLQY) and narrow emission line-width have been considered as a potential replacement for rare-earth-element (REE) phosphors used in white light-emitting-diodes (LEDs). Using QDs as phosphors for lighting not only improves the color rendering performance but also lessens the demand for REEs and hence the environmental degradation associated with their extraction and refining. However, previous QD-phosphor research was predominately based on II-VI compound semiconductor nanocrystals. Although their exquisite core/shell structures can lead to high PLQY, the heavy-metal-toxicity from cadmium ions might limit their potential for wide-spread commercialization.

Previously, we demonstrated air-stable and non-toxic silicon quantum dot phosphors (SiQD-phosphors) with PL wavelengths tunable by a $HNO_3$/HF isotropic etching process which decreases the SiQD sizes. The longer etching time resulted in smaller dot sizes and thus the more PL blue-shift due to quantum confinement effect. Here, we demonstrated that in addition to the SiQD sizes, the PL properties (peak wavelength and intensity) are closely dependent on the surface passivation chemistries of SiQDs. Efficient PL with versatile colors can be achieved by effectively controlling these two factors. The red- and yellow-emitting SiQD-phosphors can be efficiently excited by 405 nm InGaN LEDs for potential general lighting applications. The whole synthesis process is performed under ambient conditions, using common chemicals. In contrast, other main strategies for SiQD synthesis, such as solution-based precursor reduction and aerosol decomposition of silane, inevitably require critical conditions, special equipment or complex reactions.

We synthesized the SiQD-phosphors by starting with electrochemical etching on a p-type Si wafer in a mixture of HF and methanol. A typical etching condition was at a constant current density of 3.5 mA/cm$^2$ for 60 minutes. After the electrochemical etching, we obtained free-standing Si powders which exhibited weak red-emitting PL from the wafer substrate using a mechanical pulverization process, and dispersed the Si powders in ethanol. The Si powder suspension was then added with an aqueous mixture of $HNO_3$ and HF for an isotropic etching reaction. The PL color slowly and continuously shifted from red to yellow as the etching process continued. After the isotropic etching, all the Si powder suspensions were treated with 20% $HNO_3$ to grow an oxide capping layer (hydroxyl-termination, Si—OH). The silicon oxide shell resulting from the etching process isolated the SiQDs from the PL quenching ethanol and thus increased the PL intensity.

For functionalization with alkyl-alkoxysilanes, the luminescent Si powders with hydroxyl-termination were treated with 5 wt % trimethoxypropylsilane (TMPS) and re-dispersed in chloroform. For functionalization with amino-alkoxysilanes, the Si powders were treated with 5 wt % (3-aminopropyl)triethoxysilane (APTES) and re-dispersed in water. Each surface treatment step was effectively terminated by high-speed centrifugation, decantation of supernatant and re-dispersion in the desired solvents. A concentration of 1 mg of the SiQD-phosphors in 1 mL of solvent (chloroform or water) was used for all optical characterizations.

Figure 5A:
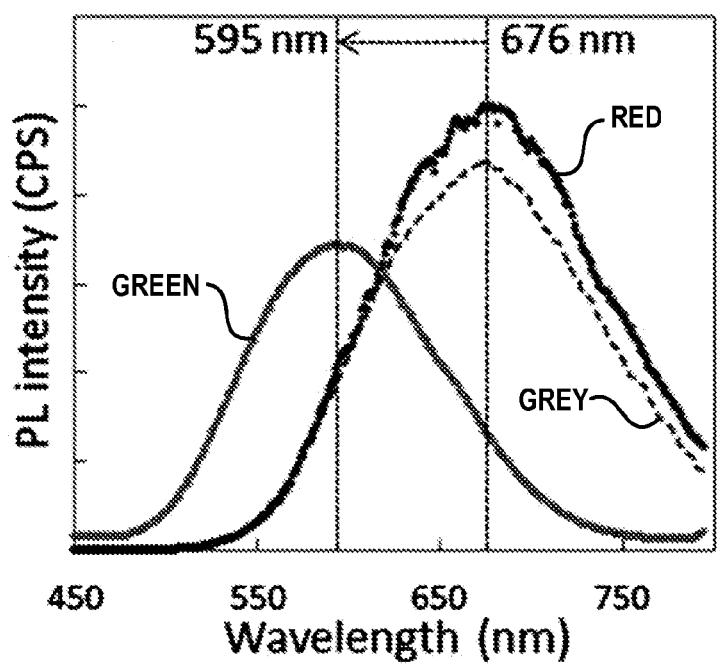
FIGS. 5A-5D. (5A), (5C) and (5D) PL spectra of the SiQD-phosphors with hydroxyl-termination (grey dotted lines), TMPS-passivation (red, orange and yellow lines) and APTES-passivation (green lines). (5B) Excitation spectra of the SiQD-phosphors in (a). CPS: counts per second.

The PL and excitation spectra of the SiQD-phosphors with hydroxyl-termination, TMPS-passivation and APTES-passivation were measured by using a fluorometer (Jobin Yvon Horiba Fluorolog FL-3). All the PL spectra were acquired by using 405 nm excitation. By $HNO_3$/HF isotropic etching and subsequent $HNO_3$ treatment, we first obtained the hydroxyl-terminated SiQD-phosphor suspensions in ethanol with PL peak wavelengths at red (676 nm), orange (630 nm) and yellow (616 nm), as represented by grey dashed lines in FIGS. 5A, 5C and 5D, respectively. Then, half of each hydroxyl-terminated sample was put through functionalization with TMPS, while the other half was treated with APTES. The TMPS-passivated SiQD-phosphor suspensions in chloroform, represented by red, orange and yellow lines in FIGS. 5A, 5C and 5D, kept almost the same PL peak wavelengths and intensities as the hydroxyl-terminated ones. In contrast, the APTES-passivated SiQD-phosphor suspensions in water, represented by green lines in FIGS. 5A, 5C and 5D, showed significant PL blue-shift in different amounts: from 676 nm to 595 nm, 630 nm to 593 nm and 616 nm to 577 nm for the red, orange and yellow samples, respectively. At the same time, the PL intensity became lower than the hydroxyl-terminated ones, and more intensity decrease was observed for samples with shorter starting wavelengths. The decrease of PL intensity is likely due to the strong polarity nature of the passivating ligands (APTES) and the solvent environment (water). The dipoles attract either electrons or holes to surface trap states and therefore reduce the PL intensity.

Figure 5B:
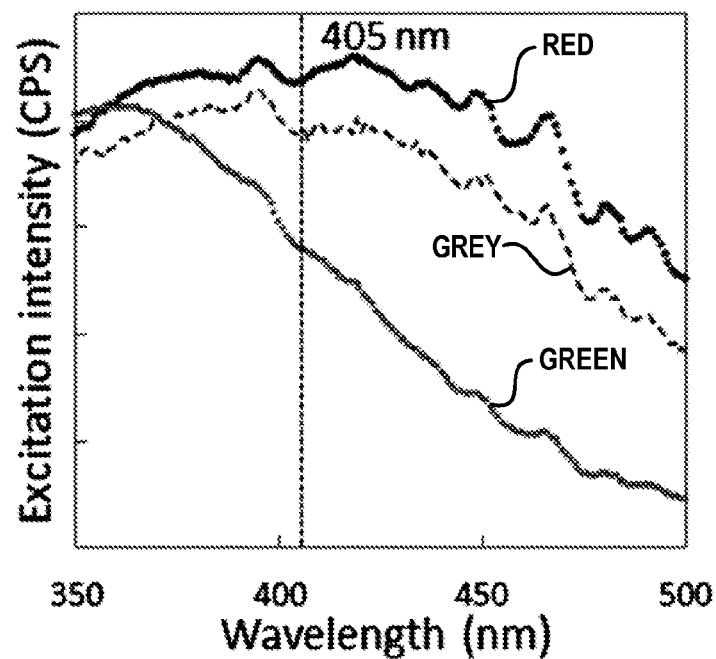
Figure 5C:
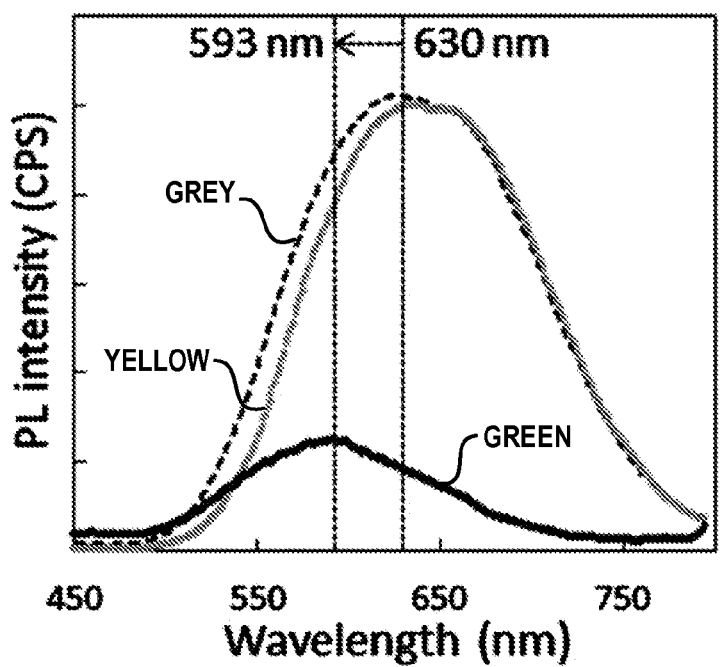
Figure 5D:
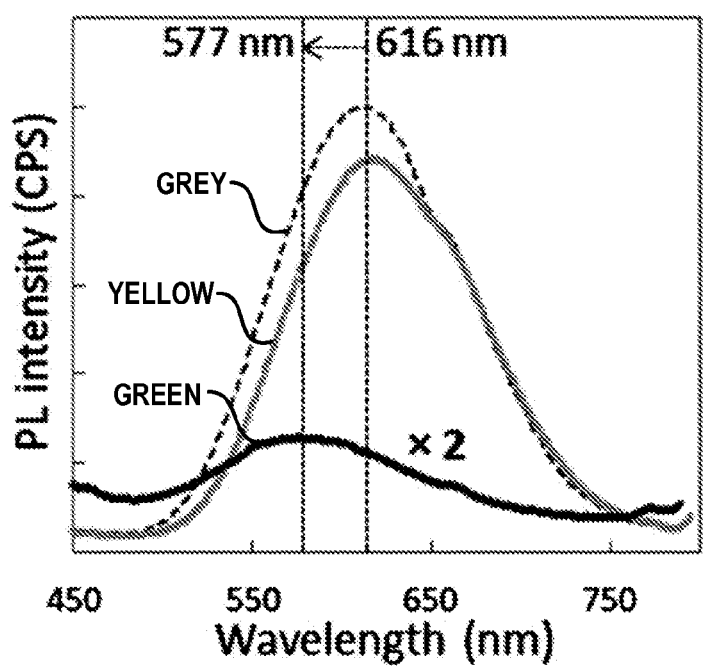

As shown in FIG. 5B, the TMPS-passivated (red line) and the hydroxyl-terminated (grey dashed line) SiQD-phosphors showed broadband excitation spectra, maintaining excitation efficiency of more than 70% from 350 nm to 473 nm. In comparison, the APTES-passivated SiQD-phosphors (green line) showed a narrower excitation band width, however still maintaining about 70% of excitation efficiency at 405 nm. This property ensures the red- (red line) and the yellow-emitting (green line) phosphors in FIG. 5A can be excited efficiently by conventional 405 nm InGaN LEDs.

Figure 6A:
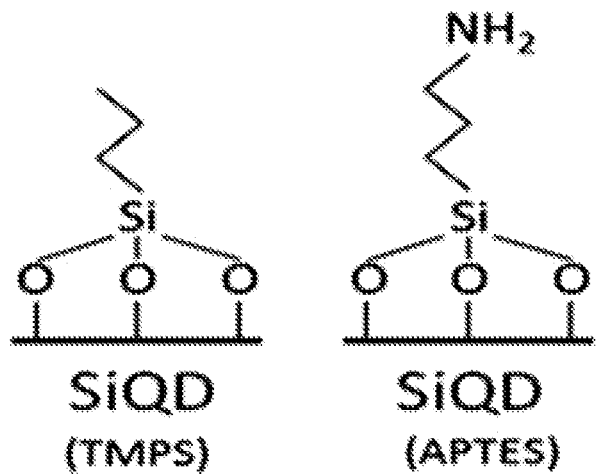
FIGS. 6A and 6B. (6A) The surface chemistries of TMPS- and APTES-passivation. (6B) A photograph of the SiQD-phosphors with TMPS- and APTES-passivation, under 365 nm UV excitation.

From the scanning electron microscope (SEM) images, the phosphors are composed of micron-size Si particles (diameters ranging from around 1 to 5 μm) with nano-porous surfaces. The visible photoluminescent SiQDs (diameter less than around 3.5 nm) are embedded in the porous Si layer as nano-size columnar structures. The surface chemistries of TMPS- and APTES-passivated SiQD-phosphors are shown in FIG. 6A. Both TMPS and APTES have three carbons in the hydrocarbon chains, while APTES is terminated with an additional amino group at the end which gives APTES a much higher polarity than TMPS. We used Fourier transform infrared spectroscopy in attenuated total reflectance mode (FTIR-ATR) to determine the surface compositions of the SiQD-phosphors in dry powder forms. Both TMPS- and APTES-passivated samples showed similar spectra. The most prominent peak was at 1050 to 1100 cm$^{-1}$ which can be a joint contribution from Si—O—Si and Si—C bonds of the attached TMPS or APTES ligands. A smaller peak was observed at 2350 cm$^{-1}$ which is likely attributed to either O—Si—H or Si—H bonds. Although the Si surface had been treated with 20% $HNO_3$, some hydride groups were still not oxidized to hydroxyl groups.

Figure 6B:
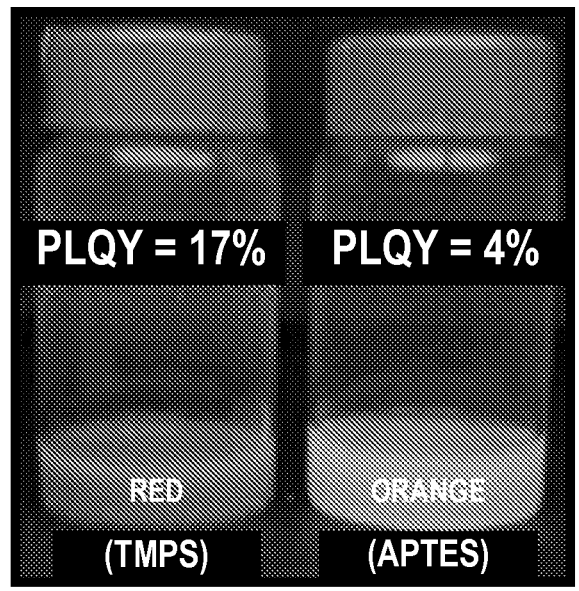

The red-emitting TMPS-passivated SiQD-phosphors in chloroform and the yellow-emitting APTES-passivated SiQD-phosphors in water are shown in FIG. 6B, under 365 nm ultra-violet (UV) excitation. Their corresponding PL spectra can be found in FIG. 5A. Note that the phosphors under 365 nm excitation exhibit almost the same PL spectra as under 405 nm excitation. The absolute PLQY of both liquid samples were measured by using an integrating sphere system (Hamamatsu Absolute PL Quantum Yield Measurement System). The PLQY=17% and 4% for the TMPS- and APTES-passivated samples, respectively. The red-emitting phosphors have shown PLQY close to previously reported SiQDs with visible PLQY=20 to 30% and synthesized by more complex methods. It is worth noticing that during the PLQY measurements, a significant portion of the PL photons emitted by the SiQDs were re-absorbed by the micron-size Si particles in the integrating sphere and hence were not collected by the spectrometer, and cannot contribute to the PLQY tally. Therefore, to improve PLQY, we will need to increase the production yield of free-standing SiQDs and decrease the amount of micron-structures in the phosphors.

Figure 7:
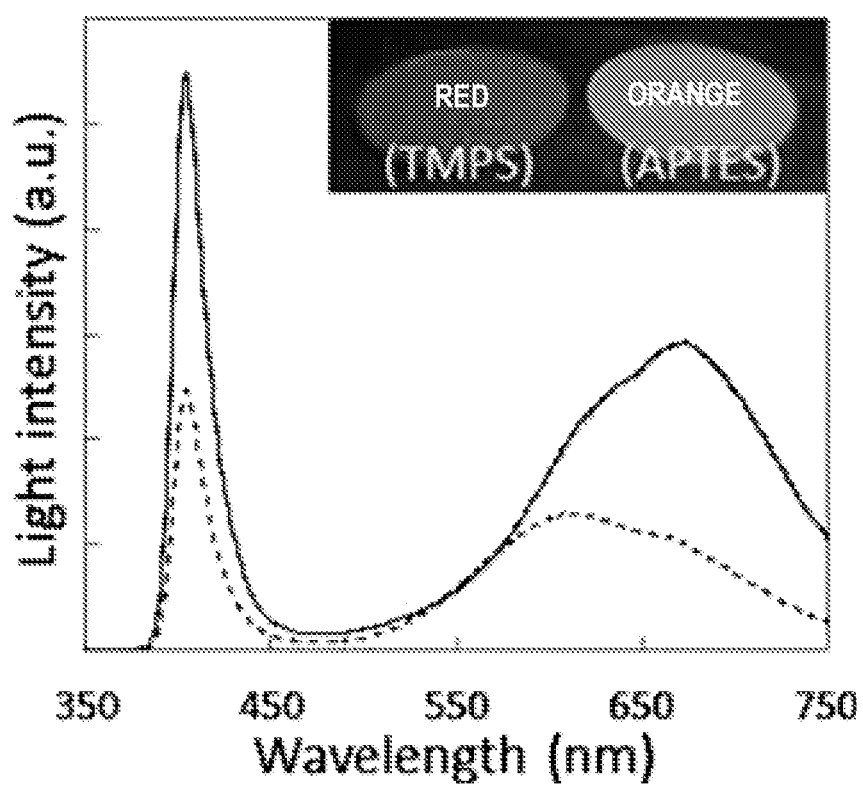
FIG. 7. Lighting spectra of 405 nm InGaN LEDs covered with only the red-emitting PDMS film (solid line), and with the red- and the yellow-emitting PDMS films (dotted line). Inset: a photograph of the PDMS films, under 365 nm UV excitation.

After being embedded in a polymer matrix, such as polydimethylsiloxane (PDMS) used in this work, the SiQD-phosphors showed consistent PL colors as they have in solution or powder forms. The inset of FIG. 7 shows the PDMS thin films embedded with the red-emitting TMPS-passivated and the yellow-emitting APTES-passivated SiQD-phosphors, under 365 nm UV excitation. We placed the film in front of 405 nm InGaN LEDs and characterized the spectra of light passing through the film, as shown in FIG. 7. With only the red-emitting PDMS film (solid line), the spectrum was composed of one blue (405 nm) and one red (674 nm) peak, resulting in a purple color. With the red-emitting PDMS film stacking on top of the yellow-emitting one (dotted line), the peak was shifted to yellow (608 nm) and was broadened, i.e., full width at half maximum (FWHM) increasing from 142 nm to 153 nm, and the integrated PL intensity became almost half. To cover the whole visible spectrum, we are currently developing green-emitting SiQD-phosphors with PL peak wavelengths at around 500 nm. However, blue- or green-emitting SiQDs with enlarged band gap, due to quantum confinement effect, suffer from surface trapping states associated with Si═O bonds which limit the radiative recombination energy to around 590 nm. Therefore, rather than oxide capping, an oxygen-free surface passivation method, such as hydrosilylation with alkenes or alkynes, will be preferred for blue- or green-emitting SiQDs.

APTES is only different from TMPS by having an additional —$NH_2$ termination at one end, as shown in FIG. 6C. However, while there is almost no change of PL peak wavelength with TMPS-passivation, the APTES-passivated SiQD-phosphors showed significant PL blue-shift compared to the hydroxyl-terminated ones. It is likely that the much stronger polarity of APTES changes the charge distribution within the SiQDs and thus affects their PL spectra. Similarly, computational studies have shown that covering SiQDs with alkyl-groups (Si—C) resulted in minimal changes in PL spectra. In contrast, SiQDs with —$HN_2$, —SH and —OH terminations exhibited obvious PL changes compared to hydride-capped SiQDs. Experimentally, 1 to 2 nm SiQDs capped with either allylamine ($CH_2$═CH—$CH_2$—$HN_2$) or 1-heptene ($CH_2$═CH—$(CH_2)_4$—$CH_3$) have also shown remarkably different PL properties. Similar to our case, both ligands have short alkyl-chains, but allylamine has an —$HN_2$ termination at one end.

By using a time-correlated single photon counting (TCSPC) technique with 375 nm laser pulses repeated in more than 1 µs, we found that both TMPS- and APTES-passivated SiQD-phosphors have PL decay in the microseconds range. Such slow PL, compared to fast PL in the nanoseconds range of direct band gap CdSe QDs, are likely due to ultra-fast trapping into, and then slow decay from, the oxide surface states which form within the band gap during oxidation. In our SiQD-phosphors, the silicon oxide capping layer resulting from the $HNO_3$ treatment should be responsible for the air-stable and long-lifetime PL.

In conclusion, the SiQD-phosphors with hydroxyl-termination were synthesized by electrochemical etching, followed by $HNO_3$/HF isotropic etching for controlling the PL peak wavelength and $HNO_3$ treatment for capping with an oxide shell. Subsequent functionalization with APTES induced significant PL blue-shift. In contrast, functionalization with TMPS resulted in almost no change of PL peak wavelength. All the SiQD-phosphors have shown air-stable and consistent PL in solution or powdered forms, or after being embedded in a polymer matrix. The red-emitting TMPS-passivated phosphors (PLQY=17%) and the yellow-emitting APTES-passivated phosphors (PLQY=4%) can be efficiently excited by 405 nm InGaN LEDs for potential applications in general lighting.

While illustrative embodiments have been illustrated and described, it will be appreciated that various changes can be made therein without departing from the spirit and scope of the invention.

The embodiments of the invention in which an exclusive property or privilege is claimed are defined as follows:

1. A silicon phosphor comprising:
a core comprising a silicon particle;
a plurality of silicon nanoparticles attached to the core;
a silicon oxide layer substantially encapsulating each of the plurality of silicon nanoparticles; and
a passivating layer comprising a plurality of passivating ligands bound to the silicon oxide layer.

2. The silicon phosphor of claim 1, wherein the core has a diameter of between about 10 nm and about 10 µm.

3. The silicon phosphor of claim 1, wherein the core is capable of scattering UV, visible, and infrared light.

4. The silicon phosphor of claim 1, wherein each nanoparticle in the plurality of silicon nanoparticles has a diameter between 1 nm and 5 nm.

5. The silicon phosphor of claim 1, wherein the plurality of passivating ligands are selected from the group consisting of alkyls, alkenyls, alkynyls, aromatics, aromatic heterocycles, conjugated aromatics, polyenes, cyanides, hydroxys, alkoxys, carboxylates, phenoxys, siloxys, cyanates, thioalkyls, thioaryls, thiocyanates, silylthios, substituted silyl groups, amino groups, mono-substituted amines, di-substituted amines, imino groups, silylaminos, alkoxy silanes, alkyl alkoxysilanes, and amino alkoxysilanes.

6. The silicon phosphor of claim 1, wherein the plurality of passivating ligands includes trimethoxypropylsilanes.

7. The silicon phosphor of claim 1, wherein the plurality of passivating ligands includes (3-aminopropyl)trimethoxysilanes.

8. A method of making silicon phosphors comprising:
(a) electrochemically etching silicon to provide a plurality of core silicon particles each having a plurality of silicon nanoparticles attached thereto;
(b) isotropically etching the plurality of silicon nanoparticles to provide a plurality of etched silicon nanoparticles;
(c) capping the plurality of etched silicon nanoparticles with an oxide layer; and
(d) passivating the oxide layer with surface ligands.

9. The method of claim 8, wherein the silicon is electrochemically etched in a solution of HF and methanol.

10. The method of claim 8, wherein the silicon is a p-type silicon wafer.

11. The method of claim 10, wherein the plurality of silicon nanoparticles are obtained from the wafer surface by mechanically pulverizing the electrochemically etched silicon.

12. The method of claim 8, wherein the plurality of silicon nanoparticles are isotropically etched in an aqueous solution comprised of $HNO_3$ and HF.

13. The method of claim 8, wherein the plurality of etched silicon nanoparticles are capped with a silicon oxide layer in a solution comprising $HNO_3$.

14. The method of claim 8, wherein the surface ligands are selected from alkyls, alkenyls, alkynyls, aromatics, aromatic heterocycles, conjugated aromatics, polyenes, cyanides, hydroxys, alkoxys, carboxylates, phenoxys, siloxys, cyanates, thioalkyls, thioaryls, thiocyanates, silylthios, substituted silyl groups, amino groups, mono-substituted amines, di-substituted amines, imino groups, silylaminos, alkoxy silanes, alkyl alkoxysilanes and amino alkoxysilanes.

15. The method of claim 8, wherein the plurality of surface ligands includes trimethoxypropylsilane.

16. The method of claim 8, wherein the plurality of surface ligands includes (3-aminopropyl)trimethoxysilane.

17. The method of claim 8 further comprising the step of separating the silicon phosphors into nano-scale silicon phosphors and micron-scale silicon phosphors.

18. The method of claim 17, wherein separating comprises centrifuging a solution of the silicon phosphors such that the micron-scale silicon phosphors sediment and the nano-scale silicon phosphors remain in a supernatant, wherein the method further comprises collecting the supernatant comprising the nano-scale silicon phosphors.

19. A lighting device comprising a silicon phosphor of claim 1.

20. The lighting device of claim 19, wherein the silicon phosphor is applied directly to a blue or UV emitting light source.

21. The lighting device of claim 19, wherein the silicon phosphor is incorporated in a substantially optically translucent matrix placed adjacent to a blue or UV emitting light source.

22. The lighting device of claim 19, wherein the silicon phosphor is embedded within a bulb which encapsulates a blue or UV emitting light source.

23. The lighting device of claim 19, wherein the lighting device is selected from the group consisting of a light-emitting diode and a fluorescent lamp.

* * * * *